US012224749B2

United States Patent
Huang et al.

(10) Patent No.: US 12,224,749 B2
(45) Date of Patent: Feb. 11, 2025

(54) INTERFACE CIRCUIT, INTERFACE CIRCUIT PROTECTION METHOD, AND TERMINAL DEVICE

(71) Applicant: HUAWEI TECHNOLOGIES CO., LTD., Guangdong (CN)

(72) Inventors: Ting Huang, Shenzhen (CN); Chen Zhu, Shenzhen (CN); Yingqun Feng, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 155 days.

(21) Appl. No.: 18/043,215

(22) PCT Filed: Jul. 29, 2021

(86) PCT No.: PCT/CN2021/109327
§ 371 (c)(1),
(2) Date: Feb. 27, 2023

(87) PCT Pub. No.: WO2022/042199
PCT Pub. Date: Mar. 3, 2022

(65) Prior Publication Data
US 2024/0030915 A1  Jan. 25, 2024

(30) Foreign Application Priority Data
Aug. 31, 2020  (CN) .......................... 202010906577.4

(51) Int. Cl.
*H03K 19/0185* (2006.01)
*H02J 7/00* (2006.01)
(Continued)

(52) U.S. Cl.
CPC .... *H03K 19/018507* (2013.01); *H02J 7/0047* (2013.01); *H03K 19/003* (2013.01);
(Continued)

(58) Field of Classification Search
CPC ......... H03K 19/018507; H03K 19/003; H03K 19/018585; H03K 19/017581;
(Continued)

(56) References Cited

U.S. PATENT DOCUMENTS 10,218,129 B1 * 2/2019 Mondal ............... G06F 13/4282
10,353,853 B1 * 7/2019 Khamesra ............ G06F 13/362
(Continued)

FOREIGN PATENT DOCUMENTS

WO   WO-2024131269 A1 *  6/2024  ............... H04R 3/00

*Primary Examiner* — Seokjin Kim
(74) *Attorney, Agent, or Firm* — Fish & Richardson P.C.

(57) ABSTRACT

This disclosure provides example interface circuits, interface circuit protection methods, and terminal devices. An example interface circuit includes a switching unit, a power input end, a first function pin, a second function pin, a control signal input end, a detection port, a grounding output end, a first resistor, a second resistor, a third resistor, a fourth resistor, and an on-off apparatus. The switching unit includes a wire grounding GND end, a circuit power supply Vcc end, a first switch circuit, and a second switch circuit. The on-off apparatus includes an input pin, a first on-off pin, and a second on-off pin. The switching unit is configured to switch, in response to a control signal that is input through the control signal input end, functions corresponding to the first function pin and the second function pin.

20 Claims, 6 Drawing Sheets

(51) Int. Cl.
  *H03K 19/003* (2006.01)
  *H04R 3/00* (2006.01)
(52) U.S. Cl.
  CPC .. *H03K 19/018585* (2013.01); *H02J 2207/30* (2020.01); *H04R 3/00* (2013.01); *H04R 2420/09* (2013.01)
(58) Field of Classification Search
  CPC ........ H03K 19/017509; H03K 19/0185; H02J 7/0047; H02J 7/0045; H02J 2207/30; H04R 3/00; H04R 2420/09; G06F 13/385
  See application file for complete search history.

(56) References Cited

U.S. PATENT DOCUMENTS

| | | | |
|---|---|---|---|
| 2015/0303724 A1* | 10/2015 | Lin | H02J 7/00 439/660 |
| 2021/0321177 A1* | 10/2021 | Huang | H03H 11/34 |
| 2022/0102922 A1* | 3/2022 | Guo | H01R 13/7036 |
| 2022/0376679 A1* | 11/2022 | Huang | H03H 11/34 |

\* cited by examiner

FIG. 1

| A1 | A2 | A3 | A4 | A5 | A6 | A7 | A8 | A9 | A10 | A11 | A12 |
|---|---|---|---|---|---|---|---|---|---|---|---|
| GND | USB TX1+ | USB TX1- | Vbus | CC1 | D+ | D- | SBU1 | Vbus | USB RX2- | USB RX2+ | GND |
| GND | USB RX1+ | USB RX1- | Vbus | SBU2 | D- | D+ | CC2 | Vbus | USB TX2- | USB TX2+ | GND |
| B12 | B11 | B10 | B9 | B8 | B7 | B6 | B5 | B4 | B3 | B2 | B1 |

…
INTERFACE CIRCUIT, INTERFACE CIRCUIT PROTECTION METHOD, AND TERMINAL DEVICE

CROSS-REFERENCE TO RELATED APPLICATIONS

This application is a national stage of International Application No. PCT/CN2021/109327, filed on Jul. 29, 2021, which claims priority to Chinese Patent Application No. 202010906577.4, filed on Aug. 31, 2020. Both of the aforementioned applications are incorporated herein by reference in their entireties.

TECHNICAL FIELD

This application relates to the terminal field, and in particular, to an interface circuit, an interface circuit protection method, and a terminal device.

BACKGROUND

Currently, an interface of a mobile device can be multiplexed, for example, the interface can be used as both an earphone interface and a charging interface. For example, a universal serial bus Type-c (Universal Serial Bus Type-c, Type-c) interface is used as an example. When an earphone is accessed through the Type-c interface, the interface is an earphone interface, and when a data line is accessed through the Type-c interface, the interface is a data port or a charging interface.

When the interface of the mobile device is multiplexed, a pin for implementing a multiplexing function is provided. For example, when an earphone is accessed through the Type-c interface, a sideband use (Sideband Use, SBU) pin of the Type-c interface may be used for multiplexing, to implement switching of the microphone/grounding (MIC/GND) of the earphone. Because no symmetrical SBU pins are disposed, in the conventional technology, a switch chip of the MIC/GND is usually used for switching between the MIC and the GND, to ensure that the earphone can be normally used regardless of whether the earphone is inserted forward or backward.

However, in the interface of the mobile device, the pin for implementing the multiplexing function may be adjacent to a power input pin. For example, in the Type-c port, an SBU1 pin and an SBU2 pin are separately adjacent to a Vbus pin. The Type-c interface may be corroded or deformed during use, which causes the SBU1 pin and/or the SBU2 pin to be shorted-circuited from the Vbus pin. When a short circuit occurs and the Type-c interface is used for charging, a charging voltage may be input to the SBU1 pin and/or the SBU2 pin, resulting in burnout of a switch chip, which affects normal use of the Type-c interface.

SUMMARY

Embodiments of this application provide an interface circuit, an interface circuit protection method, and a terminal device, to mitigate a problem that in an interface of a mobile device, if a pin with a multiplexing function is short-circuited from a power input pin and charging is performed through the power input pin, a device connected to the pin with a multiplexing function is burned down, which affects normal use of the interface.

According to a first aspect, an embodiment of this application provides an interface circuit. The interface circuit includes a switching unit, a power input end, a first function pin, a second function pin, a control signal input end, a detection port, a grounding output end, a first resistor, a second resistor, a third resistor, a fourth resistor, and an on-off apparatus.

The switching unit includes a wire grounding GND end, a circuit power supply Vcc end, a first switch circuit, and a second switch circuit. The first switch circuit includes a first input end, a second input end, a first control end, and a first output end. The second switch circuit includes a third input end, a fourth input end, a second control end, and a second output end. The first output end is connected to the first function pin, and the second output end is connected to the second function pin. The first resistor is connected in series between the Vcc end and the power input end. One end of the second resistor is connected to the GND end, and the other end of the second resistor is grounded. One end of the third resistor is connected to the control signal input end, and the other end is connected to the first control end and the second control end. One end of the fourth resistor is connected to the detection port, and the other end is connected to the first input end and the third input end.

The on-off apparatus includes an input pin, a first on-off pin, and a second on-off pin. The input pin is connected to the power input end. The first on-off pin is separately connected to the second input end and the fourth input end. The second on-off pin is grounded and connected to the grounding output end. When the input pin inputs a low level, the first on-off pin is disconnected from the second on-off pin. When the input pin inputs a high level, the first on-off pin is connected to the second on-off pin. The switching unit is configured to switch, in response to a control signal that is input through the control signal input end, functions corresponding to the first function pin and the second function pin.

In this embodiment, when the interface circuit is used for charging, if the first function pin and/or the second function pin of the interface circuit are/is short-circuited from an adjacent power input pin, a charging voltage (the same as a charging voltage, for example, 10 V or 20 V) is input from the first function pin and/or the second function pin to the switching unit. In this case, because the interface is used for charging, the Vcc end of the switching unit inputs a low level, that is, the first on-off pin is disconnected from the second on-off pin, and a first normally-open pin, a second normally-closed pin, the second input end, and the fourth input end are no longer grounded. Because the first resistor, the second resistor, the third resistor, and the fourth resistor are respectively connected in series as isolation resistors on their respective paths, a current flowing through the Vcc end, the GND end, the first control end and the second control end, and the first input end and the third input end is smaller than a burnout current of the switching unit. The on-off apparatus is used and the isolation resistor is disposed at each port, so that the switching unit is in a suspended state when the switching unit does not work, and is not burned down by a voltage that is input during a short circuit, thereby ensuring normal use of the interface.

In some implementations, the switching unit is a switch chip, and the switch chip includes a Vcc pin, a GND pin, a first common pin, a second common pin, a first input pin, a second input pin, a first normally-open pin, a second normally-open pin, a first normally-closed pin, and a second normally-closed pin.

The Vcc end is the Vcc pin, the GND end is the GND pin, the first input end is the first normally-open pin, the second input end is the second normally-open pin, the third input end is the second normally-closed pin, the fourth input end is the first normally-closed pin, the first control end is the first input pin, the second control end is the second input pin, the first output end is the first common pin, and the second output end is the second common pin.

In some implementations, the on-off apparatus is an NMOS transistor. A gate of the NMOS transistor is the input pin, a drain of the NMOS transistor is the first on-off pin, and a source of the NMOS transistor is the second on-off pin.

In some implementations, the on-off apparatus is a PMOS transistor. A gate of the PMOS transistor is the input pin, a source of the PMOS transistor is the first on-off pin, and a drain of the PMOS transistor is the second on-off pin.

In some implementations, a resistance value range of the fourth resistor is from 100 ohms to 300 ohms.

In some implementations, the interface circuit is an interface circuit having a universal serial bus Type-c interface, the first function pin is a first sideband use SBU pin of the Type-c interface, and the second function pin is a second sideband use SBU pin of the Type-c interface.

In some implementations, the interface circuit further includes a first filter capacitor, and the Vcc end is grounded through the first filter capacitor.

In some implementations, the interface circuit further includes a second filter capacitor. One end of the second filter capacitor is connected to the input pin, and the other end of the second filter capacitor is connected to the first on-off pin.

According to a second aspect, an embodiment of this application provides an interface circuit protection method. The method is applied to the interface circuit provided in the first aspect, and the method includes: detecting a type of a device accessing the interface circuit; and if the device type is a charging device, outputting a low level to the Vcc end.

According to a third aspect, an embodiment of this application provides a terminal device, and the terminal device includes the interface circuit provided in the first aspect.

It can be understood that for beneficial effects of the second aspect and the third aspect, refer to the related description in the first aspect. Details are not described herein again.

DESCRIPTION OF EMBODIMENTS

In the following descriptions, to illustrate rather than limit, specific details such as a particular system structure and a technology are provided to make a thorough understanding of embodiments of this application. However, a person skilled in the art should know that this application may also be implemented in other embodiments without these specific details. In other cases, detailed descriptions of well-known systems, apparatuses, circuits, and methods are omitted, so that this application is described without being obscured by unnecessary details.

As used in the specification and the appended claims of this application, the term "if" may be interpreted based on context as "when", "once", "in response to determining that", or "in response to detecting that". Similarly, the phrase "if determining that" or "if detecting that" may be interpreted based on context as "once determining that", "in response to determining that", "once detecting that", or "in response to detecting that".

In addition, in the description of the specification and the appended claims of this application, the terms "first", "second", "third", and the like are merely described for distinguishing, and cannot be understood as an indication of implication of relative importance.

Reference to "one embodiment", "some embodiments", or the like described in the specification of this application means that a specific feature, structure, or feature described in connection with the embodiment is included in one or more embodiments of this application. Therefore, statements such as "in an embodiment", "in some embodiments", "in some other embodiments", and "in other embodiments" that appear at different places in this specification do not necessarily mean referring to a same embodiment. Instead, the statements mean "one or more but not all of embodiments", unless otherwise specifically emphasized in another manner. The terms "include", "have", and their variants all mean "include but are not limited to", unless otherwise specifically emphasized in another manner.

Figure 1:
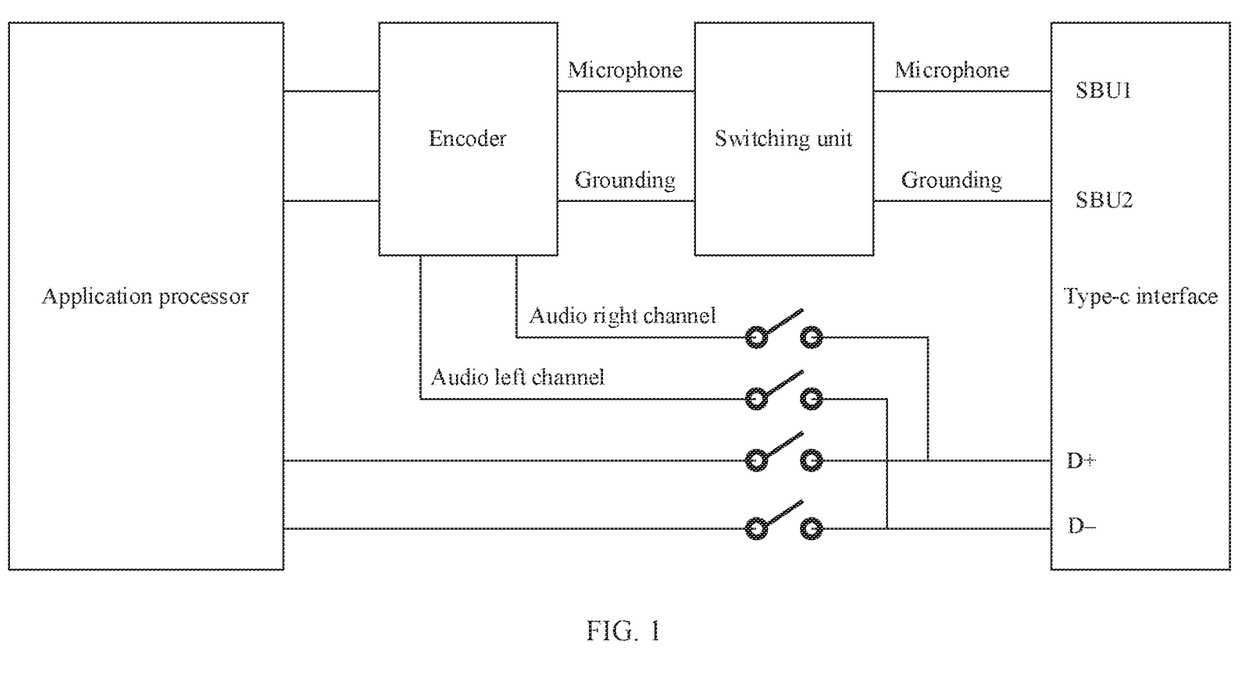
FIG. 1 is a schematic diagram of an application scenario of an interface circuit according to an embodiment of this application.

The interface circuit provided in this application may be an interface that can be multiplexed, for example, charging and multiplexing of an audio device, or multiplexing of charging and data transmission. For example, FIG. 1 shows an application scenario of an interface circuit. As shown in FIG. 1, a Type-c interface is used as an example for description.

Refer to the interface shown in FIG. 1. The interface is a Type-c interface, and therefore the interface circuit may be applied to a terminal device having a Type-c interface, such as a smartphone, a tablet computer, a smart watch, or the like.

In this scenario, the interface circuit provided in this application may be a microphone circuit that is in a terminal device and that is accessed through the Type-c interface. The interface circuit can protect a switching unit in the microphone circuit from burned down by a current during a short circuit. The switching unit is configured to switch, in response to a control signal that is input through a control signal input end, functions corresponding to an SBU1 and an SBU1. For example, refer to a Type-c interface shown in FIG. 2. The Type-c interface includes two groups of ports that are disposed symmetrically, and can be normally used whether the Type-c interface is inserted forward or backward. When an earphone is inserted into the Type-c interface, a CC1 and a CC2 may be used to determine a port direction when the earphone accesses the Type-c interface, to determine several specific ports used for data transmission of the earphone.

Figure 2:
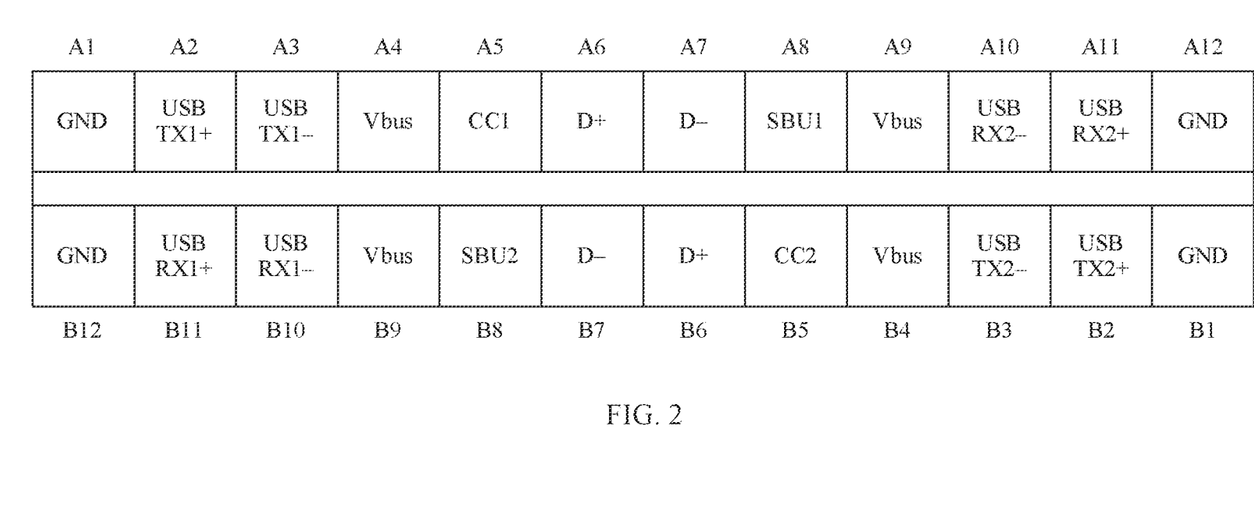
FIG. 2 is a schematic diagram of a structure of a Type-c interface according to an embodiment of this application.

For example, if an application processor determines that a group of ports including the CC1 faces upward, data of an audio right channel may be transmitted through a D+ port of A6 and data of an audio left channel may be transmitted through D− of B7. The earphone can receive audio data from the left channel and the right channel through A6 and B7, and respectively play corresponding audio data through a left earphone and a right earphone. In addition, after determining a port direction through the CC1, the application processor further needs to control the switching unit to set the SBU1 as a microphone input port and set the SBU2 as a grounding port. After receiving an audio signal, a microphone transmits the audio signal to an encoder, and the encoder processes the audio signal and then sends a processed audio signal to the application processor or to the earphone for playing. Correspondingly, if the application processor determines the port direction through the CC2, the application processor further needs to control the switching unit to set the SBU1 as a grounding port and set the SBU2 as a microphone input port.

However, the SBU1 and the SBU2 are separately adjacent to Vbus in the Type-c port, and the Type-c interface may be corroded or deformed during use, which causes the SBU1 and/or SBU2 to be short-circuited from Vbus. When a short circuit occurs and the Type-c interface is used for charging, a charging voltage may be input to the SBU1 and/or the SBU2, resulting in burnout of a switch chip, which affects normal use of the Type-c interface.

To resolve this, this application provides an interface circuit, to mitigate a problem that in a Type-c interface, if an SBU1 and/or an SBU2 are/is short-circuited from Vbus and charging is performed through Vbus, a switching unit is burned down, which affects normal use of the Type-c interface.

Figure 3:
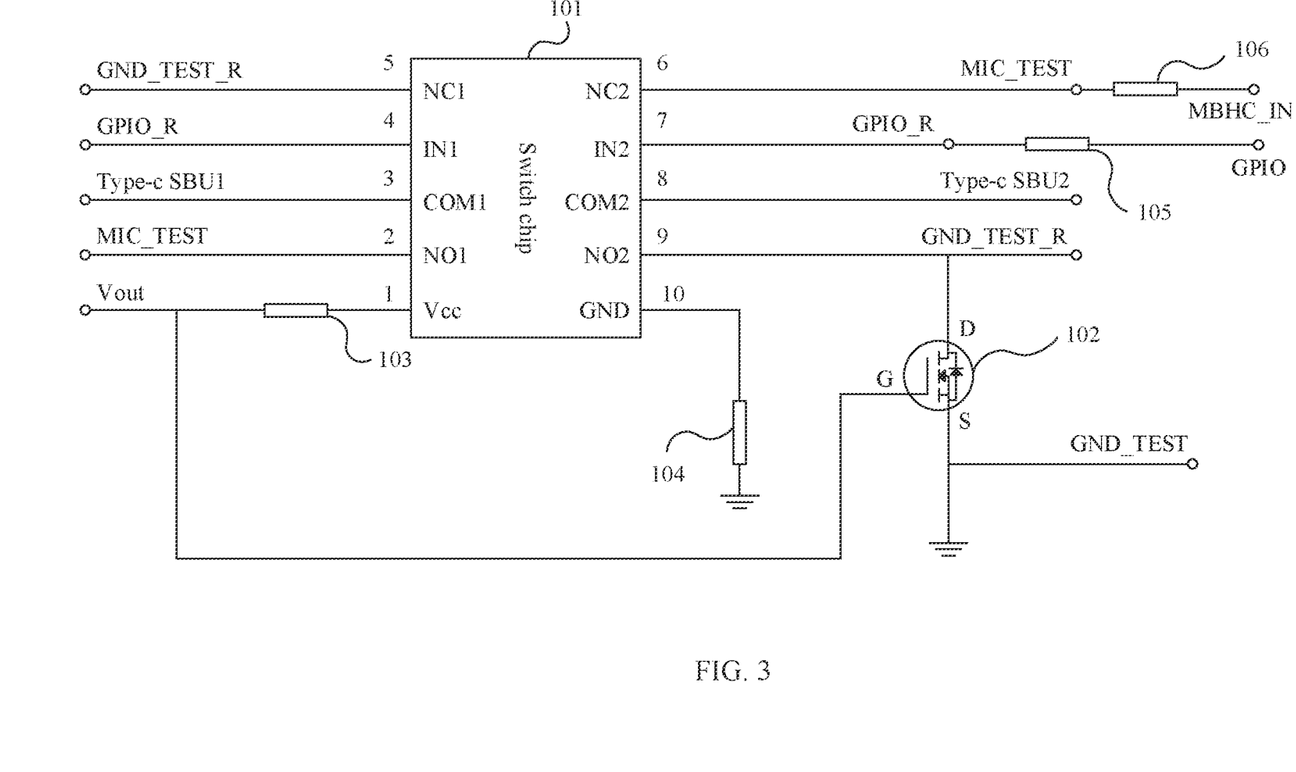
FIG. 3 is a schematic diagram of a structure of an interface circuit according to an embodiment of this application.

FIG. 3 is a schematic diagram of a structure of an interface circuit according to this application.

In FIG. 3, in the interface circuit, a switching circuit is implemented in a form of a switch chip. The switch chip includes a Vcc pin (Vcc), a GND pin (GND), a first common pin (COM1), a second common pin (COM2), a first input pin (IN1), a second input pin (IN2), a first normally-open pin (NO1), a second normally-open pin (NO2), a first normally-closed pin (NC1), and a second normally-closed pin (NC2).

A Vcc end is the Vcc pin (Vcc), a GND end is the GND pin (GND), a first input end is the first normally-open pin (NO1), a second input end is the second normally-open pin (NO2), a third input end is the second normally-closed pin (NC2), a fourth input end is the first normally-closed pin (NC1), a first control end is the first input pin (IN1), a second control end is the second input pin (IN2), a first output end is the first common pin (COM1), and a second output end is the second common pin (COM2).

It should be noted that in FIG. 3, an on-off apparatus is an NMOS transistor. A gate (G) of the NMOS transistor is an input pin, a drain (D) of the NMOS transistor is a first on-off pin, and a source (S) of the NMOS transistor is a second on-off pin. Alternatively, in another implementation, the on-off apparatus may be a PMOS transistor.

When the on-off apparatus is a PMOS transistor, a gate (G) of the PMOS transistor is the input pin, a source (S) of the PMOS transistor is the first on-off pin, and a drain (D) of the PMOS transistor is the second on-off pin.

In some implementations, the interface circuit shown in FIG. 3 is an interface circuit applied to a Type-c interface. A first function pin is a first SBU pin of the Type-c interface (Type-c SBU1), and a second function pin is a second SBU pin of the Type-c interface (Type-c SBU2). Certainly, the interface circuit may alternatively be an interface at which another function pin is adjacent to a power input pin. This is not limited herein.

In the interface circuit shown in FIG. 3, the COM1 pin of the switch chip is connected to the SBU1 pin of the Type-c interface, and the COM2 pin of the switch chip is connected to the SBU2 pin of the Type-c interface. A first resistor 101 is connected in series between the Vcc pin of the switch chip and a power input end (Vout). One end of a second resistor is connected to the GND pin of the switch chip, and the other end of the second resistor is grounded. One end of a third resistor is connected to the IN1 pin and the IN2 pin of the switch chip to form a control signal input network (GPIO_R), and the other end is connected to a control signal input end (GPIO). One end of a fourth resistor is connected to the NO1 pin and the NC2 pin of the switch chip to form a collection signal input network (MIC_TEST), and the other end is connected to a detection port (MBHC_IN). The gate of the NMOS transistor is connected to the power input end (Vcc). The drain of the NMOS transistor is separately connected to the NO2 pin and the NC1 pin of the switch chip to form a grounding output network (GND_TEST_R). The source of the NMOS transistor is grounded and connected to a grounding output end (GND_TEST). When the input pin inputs a low level, the first on-off pin is disconnected from the second on-off pin. When the input pin inputs a high level, the first on-off pin is connected to the second on-off pin. The switching unit is configured to switch, in response to a control signal that is input through the control signal input end, functions corresponding to the first function pin and the second function pin.

It should be further noted that the first resistor 103, the second resistor 104, the third resistor 105, and the fourth resistor 106 are isolation resistors used for protection. To implement a protection and isolation function, resistance values of the resistors need to meet a preset requirement to limit a current of a circuit in which each of the resistors is located, so that a current flowing through the switch chip is smaller than a burnout current of the switch chip. For example, in the scenario shown in FIG. 3, a resistance value of the first resistor may be 3.3 k ohms, a resistance value of the second resistor 104 may be 1.5 k ohms, a resistance value of the third resistor 105 may be 1 k ohms, and a resistance value of the fourth resistor 106 may be 100 ohms to 300 ohms. However, the resistance values are not limited thereto.

Figure 4:
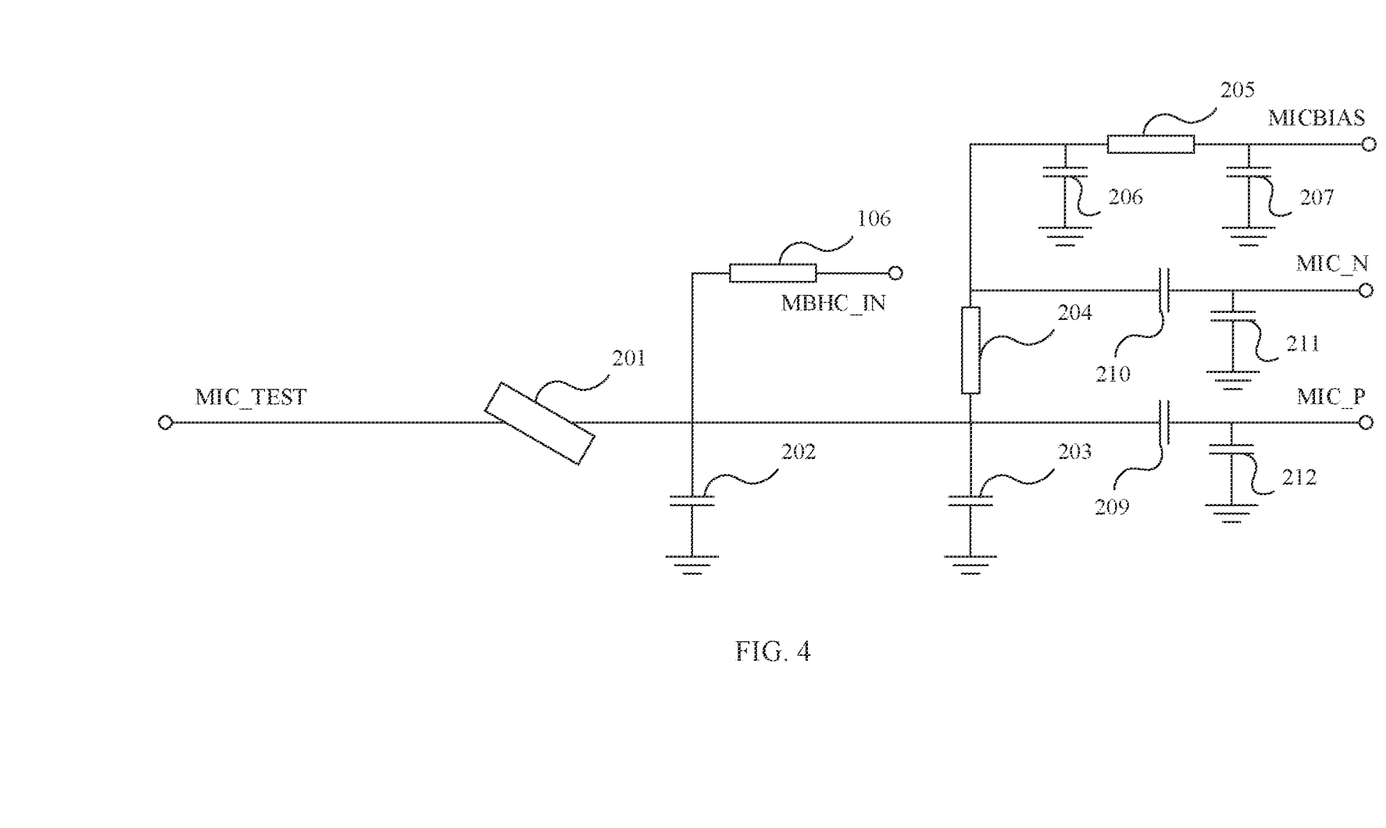
FIG. 4 is a schematic diagram of a structure of a collection circuit connected to an interface circuit according to an embodiment of this application.

The fourth resistor is disposed in a collection circuit connected to the interface circuit, and the collection circuit is configured to collect an audio signal. FIG. 4 is a schematic diagram of a structure of a collection circuit.

Refer to FIG. 4. For example, the collection circuit includes a first inductor 201, the fourth resistor 106, a first capacitor 202, a second capacitor 203, a third capacitor 206, a fourth capacitor 207, a fifth capacitor 209, a sixth capacitor 210, a seventh capacitor 211, an eighth capacitor 212, a fifth resistor 204, a sixth resistor 205, a signal input port (MIC_TEST), a signal control port (MBHC_IN), a bias voltage input port (MICBIAS) of a microphone, a positive output port (MIC_P) of the microphone, and a negative output port (MIC_N) of the microphone. In the foregoing components, one end of each of the first capacitor 202, the second capacitor 203, the third capacitor 206, the fourth capacitor 207, the seventh capacitor 211, and the eighth capacitor 212 is grounded, and the other ends are separately connected to a plurality of locations in the circuit to filter clutter in the circuit. The fifth capacitor 209 is connected in series between the signal input port and the forward output port of the microphone, and is configured to isolate a direct-current signal. The sixth capacitor 210 is connected in series between the signal input port and the negative output port of the microphone, and is also configured to isolate a direct-current signal. The fifth resistor 204 and the sixth resistor 205 are connected in series between the signal input port and the bias voltage input port of the microphone to isolate the signal input port and the bias voltage input port of the microphone.

For example, the first capacitor 202 may be a capacitor of 10 nf, the second capacitor 203, the seventh capacitor 211, and the eighth capacitor 212 may be capacitors of 33 pf, the third capacitor 206 may be a capacitor of 2.2 pf, the fifth capacitor 20) and the sixth capacitor 210 may be capacitors of 100 nf, and the fourth capacitor 207 may be a capacitor of 1 µf Resistance values of the fifth resistor 204 and the sixth resistor 205 may be 1.1 k ohms.

When the Type-c interface is used for charging, a charging interface is connected to a power output Vbus pin of the Type-c interface, to input a charging voltage from the Vbus pin. If the Vbus pin of the Type-c interface is short-circuited from the first SBU pin and/or the second SBU pin, the first common signal pin and/or the second common signal pin of the switch chip input/inputs a high voltage (the same as the charging voltage, such as 10 V or 20 V). If the Type-c interface is used for charging, the input pin inputs a low level, to be specific, the first on-off pin is disconnected from the second on-off pin, and the first normally-open pin and the second normally-closed pin are disconnected from a grounding end. The first resistor isolates the Vcc pin and an input port of the Vcc pin, the second resistor isolates the GND pin and the grounding end, the third resistor isolates a control input port and a control pin connected to the third resistor, and the fourth resistor isolates the signal input port and a signal control port. In addition, in the collection circuit, the sixth resistor isolates the signal input port and the bias voltage input port of the microphone, the fifth capacitor isolates a direct-current signal between the signal input port and the positive output port of the microphone, and the sixth capacitor isolates a direct-current signal between the signal input port and the negative output port of the microphone. Therefore, an input high voltage is shunted to a resistor corresponding to each port, so that a current flowing through the Vcc pin, the GND pin, the second normally-open pin, the first normally-closed pin, a first control pin, and a second control pin is less than a burnout current of the switch chip. The first normally-open pin and the second normally-closed pin are disconnected from the grounding end, so that the first normally-open pin and the second normally-closed pin are disconnected from the grounding end. The on-off apparatus is used and the isolation resistor is disposed for the pin, so that the switch chip is in a suspended state and is not burned down by a high voltage that is input during a short circuit.

In addition, when the switch chip normally works, a working current of a switch is only 10 uA, and a voltage drop of the switch for the ground is 0.01 V, so that working of the switch chip is not affected after a plurality of resistors are connected in series, and the switch chip can still implement normal signal communication.

It should be noted that a value of a current passing through the signal control port can be used to determine whether an earphone that is connected to the Type interface and that enters a low power consumption mode exits the low power consumption mode. To ensure that a mobile device can enable the earphone to exit the low power consumption mode correctly, it is required to ensure that an input level of MBHC_IN is less than 125 mV after a key of the earphone is pressed. Therefore, the resistance value of the fourth resistor should be 100 ohms to 300 ohms.

For example, an impedance is 338 ohms to 740 ohms when the key of the earphone is pressed. When the resistance value of the fourth resistor is 300 ohms, the input level of MBHC_IN after the key of the earphone is pressed rises from 86 mV before serial connection to 125 mV, which can still ensure that the earphone normally exits the low power consumption mode when an impedance of the earphone key is maximum. In addition, because an impedance of a microphone of the earphone is at least 800 ohms, and a level of the microphone is 0.19 V, the input level of MBHC_IN is greater than 125 mV when the key is not pressed, to prevent the earphone to enter the low power consumption due to an erroneous trigger.

Figure 5:
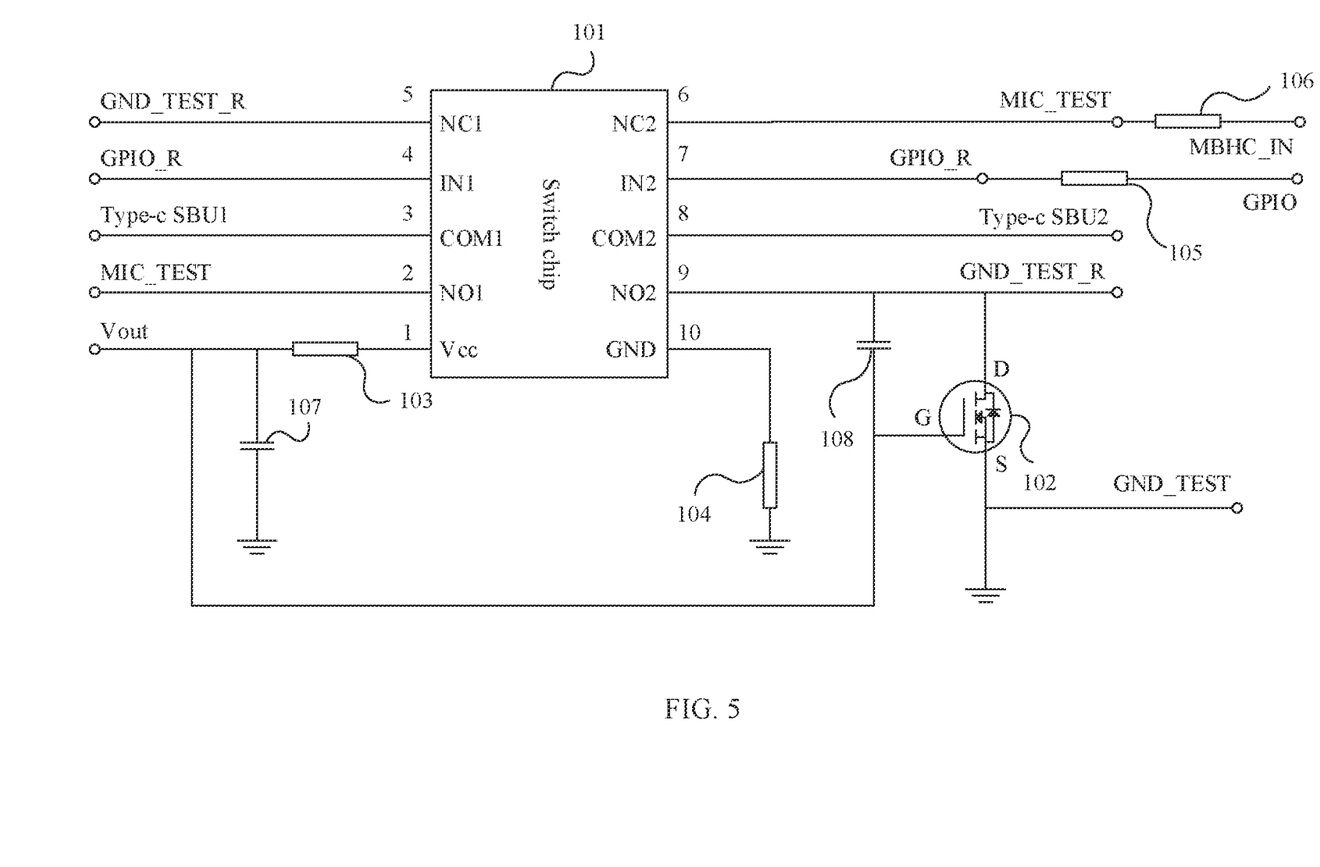
FIG. 5 is a schematic diagram of a structure of another interface circuit according to an embodiment of this application.

FIG. 5 is a schematic diagram of a structure of another interface circuit according to this application.

Refer to FIG. 5. In some implementations, the interface circuit further includes a first filter capacitor and a second filter capacitor. The Vcc end is grounded through the first filter capacitor. One end of the second filter capacitor is connected to the input pin, and the other end of the second filter capacitor is connected to the first on-off pin.

In this embodiment, the first filter capacitor and the second filter capacitor are added to the interface circuit, so that clutter in the circuit can be filtered out, thereby ensuring stability of the interface circuit.

Figure 6:
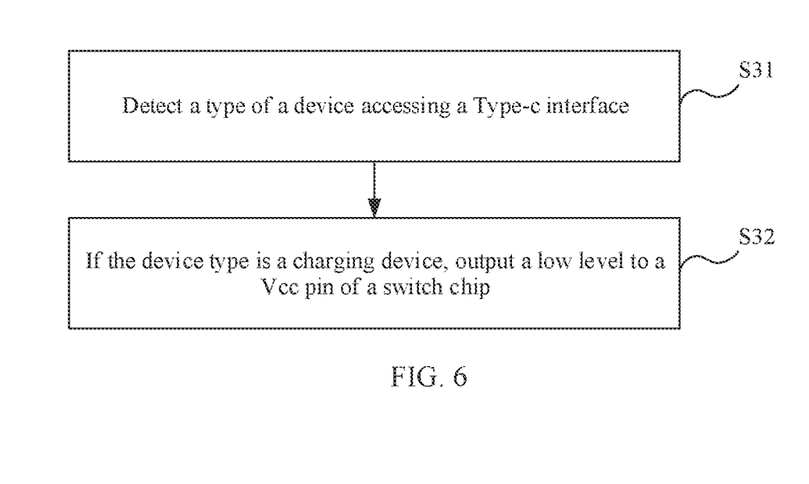
FIG. 6 is a schematic flowchart of an interface circuit protection method according to an embodiment of this application.

FIG. 6 shows another interface circuit protection method according to this application.

Refer to FIG. 6. The method is applied to the interface circuit provided above, and the method includes the following steps.

S31: Detect a type of a device accessing the interface circuit.

S32: If the device type is a charging device, output a low level to the Vcc end.

In some implementations, for example, the interface circuit is a Type-c interface. An application processor of a terminal device may determine, based on a pin used after the access device accesses the interface, the type of the device accessing the interface circuit. For example, for a charging device, pins to be used include Vbus, GND, and the like. For an audio device, pins such as the SBU1, the SBU2, the CC1, or the CC2, and D+ and D− may be used. When the application processor determines that the type of the accessed device is a charging device, such as a charger or a mobile power pack, because the Vbus pin is used for charging, to prevent Vbus from being short-circuited from the SBU1 and/or the SBU2 to burn down the interface circuit, the application processor needs to control a power supply module to set a level of the power input end of the interface circuit to a low level. In this case, because the interface is used for charging, the Vcc end of the switching unit inputs a low level, that is, the first on-off pin is disconnected from the second on-off pin, and the first normally-open pin, the second normally-closed pin, the second input end, and the fourth input end are no longer grounded. Because the first resistor, the second resistor, the third resistor, and the fourth resistor are respectively connected in series as isolation resistors on their respective paths, a current flowing through the Vcc end, the GND end, the first control end and the second control end, and the first input end and the third input end is smaller than a burnout current of the switching unit. The on-off apparatus is used and the isolation resistor is disposed at each port, so that the switching unit is in a suspended state when the switching unit does not work, and is not burned down by a voltage that is input during a short circuit.

In some implementations, when the application processor determines that the type of the accessed device is an external device, such as an audio device, the application processor may control the power supply module to set the level of the power input end of the interface circuit to a high level, so that the interface circuit normally works.

An embodiment of this application further provides a terminal device, and the terminal device includes the interface circuit provided above.

For example, the interface circuit is a Type-c interface circuit, and therefore the terminal device is a smartphone, a tablet computer, a notebook computer, a wearable device, or the like that has a Type-c interface.

In the foregoing embodiments, the descriptions of each embodiment have respective focuses. For a part that is not described in detail in an embodiment, refer to related descriptions in other embodiments.

A person of ordinary skill in the art may be aware that, circuit modules and algorithm steps in the examples described with reference to embodiments disclosed in this specification can be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

In embodiments provided in this application, it should be understood that the disclosed transmission device and method may be implemented in other manners. For example, the embodiments described above are merely examples. For example, division of each circuit module in a transmission device is merely logical function division, and there may be another division manner in actual implementation. For example, a plurality of elements may be combined or integrated into another circuit module, or some features may be ignored or not performed. In addition, the displayed or discussed mutual couplings or direct couplings or communication connections may be implemented through some interfaces. The indirect couplings or communication connections between the apparatuses or units may be implemented in electronic or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of embodiments.

The foregoing embodiments are merely intended to describe the technical solutions of this application, but are not to limit this application. Although this application is described in detail with reference to the foregoing embodiments, a person of ordinary skill in the field should understand that they may still make modifications to the technical solutions described in the foregoing embodiments or make equivalent replacements to some technical features thereof, without departing from the scope of the technical solutions of embodiments of this application, and these modifications and replacements shall fall within the protection scope of this application.

What is claimed is:

1. An interface circuit, wherein the interface circuit comprises a switching unit, a power input end, a first function pin, a second function pin, a control signal input end, a detection port, a grounding output end, a first resistor, a second resistor, a third resistor, a fourth resistor, and an on-off apparatus;
    the switching unit comprises a wire grounding GND end, a circuit power supply Vcc end, a first switch circuit, and a second switch circuit, wherein the first switch circuit comprises a first input end, a second input end, a first control end, and a first output end, and the second switch circuit comprises a third input end, a fourth input end, a second control end, and a second output end;
    the first output end is connected to the first function pin, and the second output end is connected to the second function pin;
    the first resistor is connected in series between the circuit power supply Vcc end and the power input end;
    one end of the second resistor is connected to the wire grounding GND end, and the other end of the second resistor is grounded;
    one end of the third resistor is connected to the control signal input end, and the other end of the third resistor is connected to the first control end and the second control end;
    one end of the fourth resistor is connected to the detection port, and the other end of the fourth resistor is connected to the first input end and the third input end;
    the on-off apparatus comprises an input pin, a first on-off pin, and a second on-off pin;
    the input pin is connected to the power input end;
    the first on-off pin is separately connected to the second input end and the fourth input end;
    the second on-off pin is grounded and connected to the grounding output end;
    when the input pin inputs a low level, the first on-off pin is disconnected from the second on-off pin;
    when the input pin inputs a high level, the first on-off pin is connected from the second on-off pin; and
    the switching unit is configured to switch, in response to a control signal that is input through the control signal input end, functions corresponding to the first function pin and the second function pin.

2. The interface circuit according to claim 1, wherein the switching unit is a switch chip, and the switch chip comprises a Vcc pin, a GND pin, a first common pin, a second common pin, a first input pin, a second input pin, a first normally-open pin, a second normally-open pin, a first normally-closed pin, and a second normally-closed pin, wherein:
    the circuit power supply Vcc end is the Vcc pin, the wire grounding GND end is the GND pin, the first input end is the first normally-open pin, the second input end is the second normally-open pin, the third input end is the second normally-closed pin, the fourth input end is the first normally-closed pin, the first control end is the first input pin, the second control end is the second input pin, the first output end is the first common pin, and the second output end is the second common pin.

3. The interface circuit according to claim 1, wherein the on-off apparatus is an NMOS transistor; and wherein:
    a gate of the NMOS transistor is the input pin, a drain of the NMOS transistor is the first on-off pin, and a source of the NMOS transistor is the second on-off pin.

4. The interface circuit according to claim 1, wherein the on-off apparatus is a PMOS transistor; and wherein:
    a gate of the PMOS transistor is the input pin, a source of the PMOS transistor is the first on-off pin, and a drain of the PMOS transistor is the second on-off pin.

5. The interface circuit according to claim 1, wherein a resistance value of the fourth resistor is from 100 ohms to 300 ohms.

6. The interface circuit according to claim 1, wherein the interface circuit comprises a universal serial bus Type-c interface, the first function pin is a first sideband use SBU pin of the universal serial bus Type-c interface, and the second function pin is a second sideband use SBU pin of the universal serial bus Type-c interface.

7. The interface circuit according to claim 1, wherein the interface circuit further comprises a first filter capacitor, and the circuit power supply Vcc end is grounded through the first filter capacitor.

8. The interface circuit according to claim 1, wherein the interface circuit further comprises a second filter capacitor, one end of the second filter capacitor is connected to the input pin, and the other end of the second filter capacitor is connected to the first on-off pin.

9. An interface circuit protection method, wherein the interface circuit protection method is applied to the interface circuit according to claim 1, and the interface circuit protection method comprises:
- detecting a type of a device accessing the interface circuit; and
- in response to determining that the type of the device is a charging device, outputting a low level to a circuit power supply Vcc end of the interface circuit.

10. A terminal device, wherein the terminal device comprises an interface circuit;
- wherein the interface circuit comprises a switching unit, a power input end, a first function pin, a second function pin, a control signal input end, a detection port, a grounding output end, a first resistor, a second resistor, a third resistor, a fourth resistor, and an on-off apparatus;
- the switching unit comprises a wire grounding GND end, a circuit power supply Vcc end, a first switch circuit, and a second switch circuit, wherein the first switch circuit comprises a first input end, a second input end, a first control end, and a first output end, and the second switch circuit comprises a third input end, a fourth input end, a second control end, and a second output end;
- the first output end is connected to the first function pin, and the second output end is connected to the second function pin;
- the first resistor is connected in series between the circuit power supply Vcc end and the power input end;
- one end of the second resistor is connected to the wire grounding GND end, and the other end of the second resistor is grounded;
- one end of the third resistor is connected to the control signal input end, and the other end of the third resistor is connected to the first control end and the second control end;
- one end of the fourth resistor is connected to the detection port, and the other end of the fourth resistor is connected to the first input end and the third input end;
- the on-off apparatus comprises an input pin, a first on-off pin, and a second on-off pin;
- the input pin is connected to the power input end;
- the first on-off pin is separately connected to the second input end and the fourth input end;
- the second on-off pin is grounded and connected to the grounding output end;
- when the input pin inputs a low level, the first on-off pin is disconnected from the second on-off pin;
- when the input pin inputs a high level, the first on-off pin is connected from the second on-off pin; and
- the switching unit is configured to switch, in response to a control signal that is input through the control signal input end, functions corresponding to the first function pin and the second function pin.

11. The terminal device according to claim 10, wherein the switching unit is a switch chip, and the switch chip comprises a Vcc pin, a GND pin, a first common pin, a second common pin, a first input pin, a second input pin, a first normally-open pin, a second normally-open pin, a first normally-closed pin, and a second normally-closed pin, wherein:
- the circuit power supply Vcc end is the Vcc pin, the wire grounding GND end is the GND pin, the first input end is the first normally-open pin, the second input end is the second normally-open pin, the third input end is the second normally-closed pin, the fourth input end is the first normally-closed pin, the first control end is the first input pin, the second control end is the second input pin, the first output end is the first common pin, and the second output end is the second common pin.

12. The terminal device according to claim 10, wherein the on-off apparatus is an NMOS transistor; and wherein:
- a gate of the NMOS transistor is the input pin, a drain of the NMOS transistor is the first on-off pin, and a source of the NMOS transistor is the second on-off pin.

13. The terminal device according to claim 11, wherein the on-off apparatus is an NMOS transistor; and wherein:
- a gate of the NMOS transistor is the input pin, a drain of the NMOS transistor is the first on-off pin, and a source of the NMOS transistor is the second on-off pin.

14. The terminal device according to claim 10, wherein the on-off apparatus is a PMOS transistor; and wherein:
- a gate of the PMOS transistor is the input pin, a source of the PMOS transistor is the first on-off pin, and a drain of the PMOS transistor is the second on-off pin.

15. The terminal device according to claim 11, wherein the on-off apparatus is a PMOS transistor; and wherein:
- a gate of the PMOS transistor is the input pin, a source of the PMOS transistor is the first on-off pin, and a drain of the PMOS transistor is the second on-off pin.

16. The terminal device according to claim 10, wherein a resistance value of the fourth resistor is from 100 ohms to 300 ohms.

17. The terminal device according to claim 10, wherein the interface circuit comprises a universal serial bus Type-c interface, the first function pin is a first sideband use SBU pin of the universal serial bus Type-c interface, and the second function pin is a second sideband use SBU pin of the universal serial bus Type-c interface.

18. The terminal device according to claim 11, wherein the interface circuit comprises a universal serial bus Type-c interface, the first function pin is a first sideband use SBU pin of the universal serial bus Type-c interface, and the second function pin is a second sideband use SBU pin of the universal serial bus Type-c interface.

19. The terminal device according to claim 10, wherein the interface circuit further comprises a first filter capacitor, and the circuit power supply Vcc end is grounded through the first filter capacitor.

20. The terminal device according to claim 10, wherein the interface circuit further comprises a second filter capacitor, one end of the second filter capacitor is connected to the input pin, and the other end of the second filter capacitor is connected to the first on-off pin.

* * * * *